United States Patent [19]

Kircher et al.

[11] Patent Number: 4,942,554
[45] Date of Patent: Jul. 17, 1990

[54] THREE-DIMENSIONAL, ONE-TRANSISTOR CELL ARRANGEMENT FOR DYNAMIC SEMICONDUCTOR MEMORIES COMPRISING TRENCH CAPACITOR AND METHOD FOR MANUFACTURING SAME

[75] Inventors: Roland Kircher; Josef Goeltzlich, both of Munich, Fed. Rep. of Germany

[73] Assignee: Siemens Aktiengesellschaft, Berlin and Munich, Fed. Rep. of Germany

[21] Appl. No.: 259,699

[22] Filed: Oct. 18, 1988

[30] Foreign Application Priority Data

Nov. 26, 1987 [DE] Fed. Rep. of Germany ....... 3740171

[51] Int. Cl.⁵ .................... G11C 11/24; H01C 29/78
[52] U.S. Cl. .................................... 365/149; 357/23.6
[58] Field of Search ...................... 365/149; 357/23.6

[56] References Cited

U.S. PATENT DOCUMENTS

| 4,728,623 | 3/1988 | Lu et al. ............................ 357/23.6 |
| 4,801,989 | 1/1989 | Taguchi ............................ 365/149 |
| 4,830,978 | 5/1984 | Teng et al. ........................ 365/149 |

FOREIGN PATENT DOCUMENTS

| 0108390 | 5/1984 | European Pat. Off. . |
| 0167764 | 1/1986 | European Pat. Off. . |
| 0168528 | 1/1986 | European Pat. Off. . |
| 0220410 | 5/1987 | European Pat. Off. . |
| 0234384 | 9/1987 | European Pat. Off. . |

OTHER PUBLICATIONS

Japanese Abstract, vol. 9, No. 298, 60-136366, Jul. 19, 1985 by Shimizu.
M. Ohkura, "A Three-Dimensional Dram Cell of Stacked Switching-Transistor in Soi (SSS)", IEEE, Digest of Technical Papers, 1985, pp. 718-721.

Primary Examiner—Stuart N. Hecker
Assistant Examiner—Alfonso Garcia
Attorney, Agent, or Firm—Hill, Van Santen, Steadman & Simpson

[57] ABSTRACT

In a three-dimensional, one-transistor cell arrangement for dynamic semiconductor memories, whereby the capacitor for the charges to be stored is fashioned as a trench capacitor in the substrate and, separated by an insulating layer, is arranged under the selection transistor comprising an insulated gate electrode and is connected to the source/drain zone thereof in electrically conductive fashion, and whereby the source/drain zones of the selection transistor are contained in a recrystallized silicon layer applied above the insulating layer, the electricity conductive contact to the capacitor is formed by an asymmetrical trench expansion introduced into the substrate in the upper part of the trench, this asymmetrical trench expansion being filled with polycrystalline silicon having the same doping as in the trench, and the source/drain zones are produced such by ion implantation in the recrystallized silicon layer that the source zone overlaps the electrically conductive contact in the asymmetrical trench expansion. The memory cell arrangement provided enables an extremely compact memory cell having an area of less than 3 $\mu m^2$, enabling this on the basis of simple process steps; the arrangement and method can be employed in the manufacture of 64 megabit DRAMs.

13 Claims, 2 Drawing Sheets

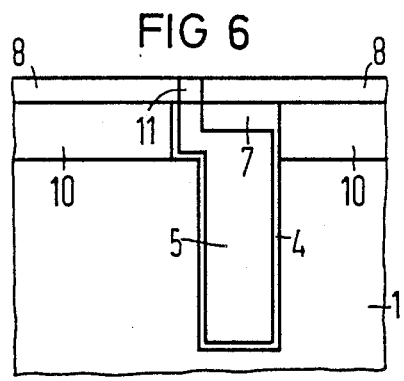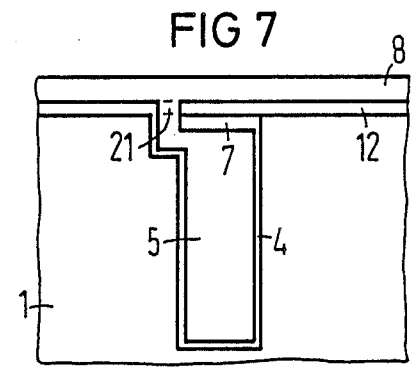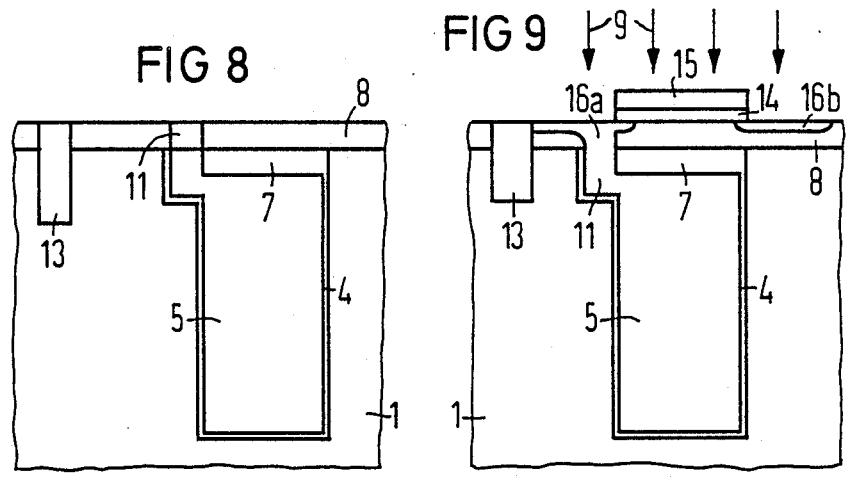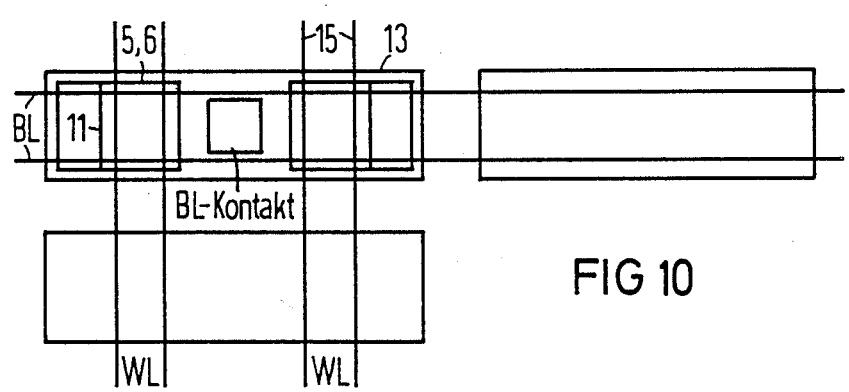

THREE-DIMENSIONAL, ONE-TRANSISTOR CELL ARRANGEMENT FOR DYNAMIC SEMICONDUCTOR MEMORIES COMPRISING TRENCH CAPACITOR AND METHOD FOR MANUFACTURING SAME

BACKGROUND OF THE INVENTION

The present invention is directed to a threedimensional, one-transistor cell arrangement for dynamic semiconductor memories. The capacitor, for the charges to be stored, is created as a trench capacitor in the substrate. The first electrode is formed by the substrate and the second electrode, that stores the charges, is formed by doped polycrystalline silicon that fills the trench. The capacitor, separated by an insulating layer, is arranged under the field effect transistor (selection transistor). An insulated gate electrode (transfer electrode/word line), that lies at the surface of the substrate, is arranged having source/drain zones generated in the recrystallized silicon layer applied on the insulating layer and is connected to the source/drain zones thereof via an electrically conductive contact.

Such an arrangement can be derived from, for example, European patent application No. 0 167 764. Such an arrangement is also disclosed in a report by M. Ohkura et al, "A Three-Dimensional DRAM Cell of Stacked Switching-Transistor in SOI", in IEDM Digest of Technical Papers; SOI technique refers to what is known as the silicon on insulator technique.

One-transistor cell/trench capacitor arrangements can also be derived from European patent application Nos. 0 234 384 and 0 108 390. These do not disclose, however, the SOI technique.

What all of these arrangements have in common is that the capacitor is executed as a trench cell in order to increase the packing density in dynamic memories (DRAMs). This is due to the smaller cell areas available and because of the capacitance quantities from 30 through 50 fF required for noise protection.

The utilization of the third dimension in the trench cell provides the possibility of realizing a cell capacitance of 40 fF given a minimum space requirement.

By introduction of the silicon on insulator technique, as disclosed in the report by Ohkura, the soft error sensitivity is reduced and a small area requirement on the order of magnitude of 5 $\mu m^2$ is realizable.

SUMMARY OF THE INVENTION

The present invention provides a three-dimensional, one-transistor cell arrangement, of the species initially cited for VLSI dynamic memory circuits, wherein a minimum area requirement per cell of less than 3 $\mu m^2$ is possible. Moreover, pursuant to the three-dimensional one-transistor cell arrangement of the present invention, punch-through and soft error sensitivity are avoided. The present invention provides a method for manufacturing these cells with this degree of integration in integrated circuits, through optimally simple, technologically controllable method steps.

To this end, the present invention provides a threedimensional, one-transistor cell arrangement for dynamic semiconductor memories. The capacitor for the charges to be stored is created as a trench capacitor in the substrate. A first electrode is formed by the substrate and a second electrode, that stores the charges, is formed by doped polycrystalline silicon filled in the trench. A capacitor, separated by an insulating layer, is arranged under the field effect transistor (selection transistor) comprising an insulated gate electrode (transfer electrode/word line) that lies at the surface of the substrate and includes source/drain zones generated in the recrystallized silicon layer applied on the insulating layer and is connected to the source/drain zones thereof via an electrically conductive contact.

An electrically conductive contact is formed by an asymmetrical expansion of the trench opening introduced into the substrate in the upper part of the trench. The asymmetrical expansion is filled with polycrystalline silicon, having the same doping as in the trench and representing a sub-region of the second electrode of the capacitor that stores the charge. The insulating layer separating the transistor from the capacitor is arranged next to the asymmetrical expansion of the trench opening in the trench having the same geometry as the original trench cross-section. The gate electrode of the transistor is arranged over the insulating layer and over the recrystallized silicon layer that is situated thereover, being arranged there at such that the source zone generated in the recrystallized silicon layer overlaps the electrically conductive contact in the asymmetrical expansion of the trench opening.

In an embodiment of the present invention, the depth of the asymmetrical expansion of the trench opening is set to a maximum of 20% of the trench depth and the expansion is set to a maximum of 50% of the trench cross-section.

In an embodiment of the present invention, the crossection of the trench is set at approximately 1 $\mu m^2$ given a depth of 6 $\mu m$.

In an embodiment, the asymmetrical expansion of the trench opening in the substrate is set to approximately 0.4 $\mu m$ and to a depth of approximately 1 $\mu m$ given a trench depth in the range of approximately 4 to about 6 $\mu m$.

In an embodiment, the thickness of the insulating layer is set to a maximum of approximately 15% of the trench depth.

In an embodiment, the trench depth is approximately 6 $\mu m$ and the depth of asymmetrical trench expansion is approximately 1 $\mu m$, and the thickness of the insulating layer is set to approximately 0.5 $\mu m$.

In an embodiment, the substrate is p+ doped, the trench fill and the asymmetrical, electrically conductive contact arranged in the trench expansion are n+ doped, the recrystallized layer containing the source/drain zones in p− doped and the source/drain zones situated therein are n+ doped.

In an embodiment, the insulation between two neighboring trench capacitors is composed of an insulating oxide that is produced by a trench etched into the substrate and by filling this trench with $SiO_2$. In an embodiment, the insulating trench has a depth of approximately 0.7 $\mu m$ and a width of approximately 0.5 $\mu m$.

A method for manufacturing a three-dimensional onetransistor cell arrangement is also provided.

Additional features and advantages of the present invention will be apparent from the detailed description of the presently preferred embodiments and from the drawings.

BRIEF DESCRIPTION OF THE DRAWINGS

FIGS. 1 through 9 illustrate cross-sectional views through the cell arrangement of the present invention illustrating the method steps of the present invention.

FIG. 10 illustrates the layout of a cell constructed pursuant to the present invention.

DETAILED DESCRIPTION OF THE PRESENTLY PREFERRED EMBODIMENTS

The present invention provides a three-dimensional transistor cell arrangement and method of making same. To achieve the advantages of the present invention, a three-dimensional, one-transistor cell is provided having:

(a) an electrically conductive contact formed by an asymmetrical expansion of the trench opening introduced into the substrate in the upper part of the trench opening and filled with polycrystalline silicon having the same doping as in the trench and represents a sub-region of the second electrode of the capacitor that stores the charge;

(b) an insulating layer, that separates the transistor from the capacitor, is arranged next to the asymmetrical expansion of the trench opening in the trench having the same geometry as the original trench cross-section; and (c) a gate electrode for the transistor is arranged over the insulating layer and the recrystallized silicon layer situated thereabove, being arranged there at such that the source zone generated in the recrystallized silicon layer overlaps the electrically conductive contact in the asymmetrical expansion of the trench opening.

The cell of the present invention provides an extremely low area requirement of less than 3 $\mu m^2$ per cell whereby an extremely high integrating density can be achieved. Furthermore, such disadvantages as punch-through do not occur. Moreover, the soft error sensitivity is extremely low.

The process for the manufacture of the cell is composed of a combination of trench process, SOI process steps, and a standard MOS process for the switching transistor. Although a sub-process of the method includes SOI process steps, the known disadvantages that are caused by floating substrates are avoided. On the contrary, the process steps can even be used to optimize the transistor properties.

Figure 1:
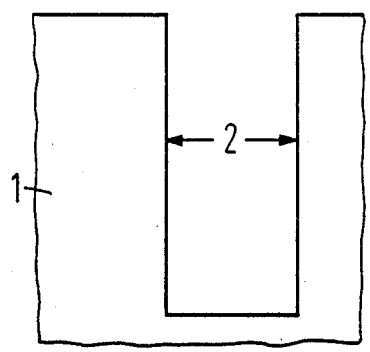
Figure 2:
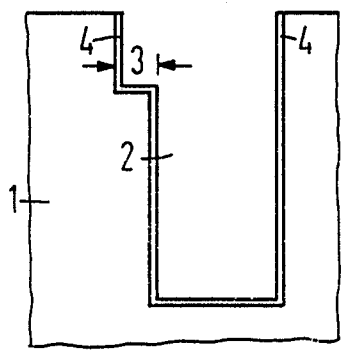

Referring now to FIG. 1, proceeding from a highly doped silicon substrate 1 having p-doping ($N_A$ greater than $10^{18}$ cm$^{-3}$), a trench 2 approximately 6 $\mu$m deep is etched having a quadratic cross-section of 1 $\mu$m times 1 $\mu$m. Subsequently, as illustrated in FIG. 2, asymmetrical etching is carried out in the side wall of the trench 2. The trench opening 2 is increased by an expansion 3 that is approximately 1 $\mu$m deep and 0.4 $\mu$m wide. After this step, the side walls of the trench 2 and of the asymmetrical expansion 3 are provided with a triple dielectric 4 composed of silicon oxide/silicon nitride/silicon oxide having an effective layer thickness of approximately 15 nm.

Figure 3:
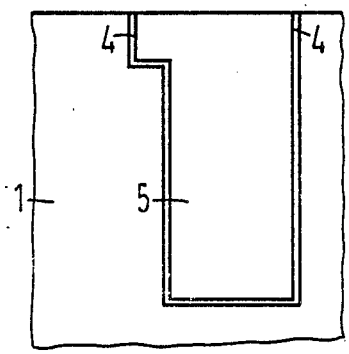

Referring now to FIG. 3, the trench 2, 3, 4 is now filled with highly doped (arsenic) polycrystalline silicon 5. The polycrystalline silicon 5 serves as an electrode for the charge storage. The other electrode is formed by the high doped silicon substrate 1.

Figure 4:
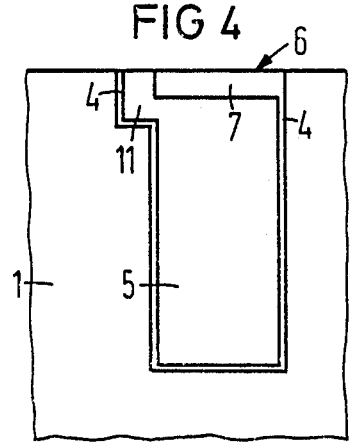

Referring now to FIG. 4, the polycrystalline silicon 5, that fills out the trench 2, is etched back by approximately 0.5 $\mu$m, creating a depression (illustrated by the arrow 6). The depression has the same cross-section as the original trench 2. The single-sided (asymmetrical) expansion 3 of the trench 2 is not effected by this etching step due to the use of masking (not shown in the figure). This is because it represents the contact to the selection transistor that is to be produced later. A silicon oxide ($SiO_2$) 7 that functions as an insulation between the trench capacitor (1, 4, 5) and the later selection transistor is introduced, by deposition from vapor phase (CVD), into the hole (6) produced in this way.

Figure 5:
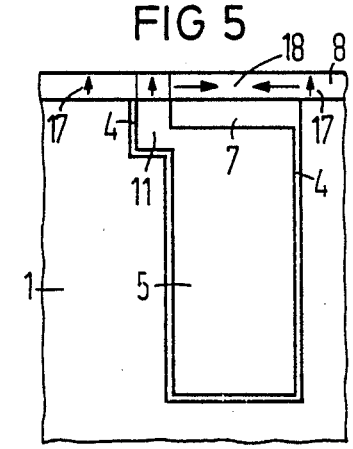

Referring now to FIG. 5, after planarization of the surface, a polycrystalline silicon or, respectively, amorphous silicon 8 lightly doped with boron is deposited on the surface of the substrate. The following alternatives are proposed for the subsequent recrystallization of the deposited silicon layer 8:

1. The layer 8 is composed of an amorphous silicon that can be rendered more amorphous with a silicon implantation (not shown in the Figure). During heating to temperatures of approximately 550° to about 660° C., this layer 8 recrystallizes both vertically (illustrated by arrow) as well as laterally (illustrated by arrow 18) above the $SiO_2$ region 7 over the trench capacitor. This embodiment is illustrated in FIG. 5.

2. Small p+ silicon substrates 1 having a p− epitaxial layer 10 are used. After the manufacture of the trench capacitor 1, 4, 5, an amorphous silicon layer 8 is deposited that is recrystallized by vertical surface epitaxy or, respectively lateral surface epitaxy. Given inadequate crystal quality, this layer 8 can be additionally recrystallized with a laser beam. The small n+ contact 11 to the trench 1, 2, 4, 5 is subsequently manufactured by a mask process and tempering/diffusion. This arrangement is illustrated in FIG. 6.

3. After the manufacture of the trench capacitor 1, 2, 4, 5, a CVD, or thermic oxide layer 12, is deposited or, respectively, generated. This is then etched off over the n+ terminal (11). Subsequently, this region is filled by local, selective epitaxy (see arrow 21). This is followed by a surfacewide polysilicon deposition 8. This polysilicon layer 8 is subsequently recrystallized by laser irradiation. FIG. 7 illustrates this embodiment.

However, one can also proceed such that, after the manufacture of the trench capacitor, as set forth in the previous embodiment, a surface-wide LPCVD oxide layer is deposited and is etched off over the n+ contact. Subsequently, a deposition of amorphous silicon is performed with subsequent planarizing reetching. After a silicon ion implantation, for further amorphization, a lateral solid-phase epitaxy is performed at approximately 550° to about 660° C. proceeding from the n+ contact (11) to the substrate (1).

Referring now to FIG. 8, the thickness of the deposited silicon layer 8 is approximately 0.4 $\mu$m. Before the selection transistor is introduced into the silicon layer 8, above the trench 1, 2, 4, 5 after the recrystallization of the layer 8 proceeding from FIG. 5, a box insulation is performed in order to prevent punch-through and cross-talk between neighboring cells. Through the box insulation, trenches 13 having a width of approximately 0.5 $\mu$m and a depth of approximately 0.7 $\mu$m are etched into the substrate 1 or, respectively into the recrystallized layer 8; the trenches 13 are then filled with silicon oxide (13).

Referring now to FIG. 9, a selection transistor is now produced in the recrystallized, boron-doped silicon layer 8. To this end, a gate oxide 14 is first grown and a gate electrode 15 composed of doped polycrystalline silicon or of metal silicide is deposited thereover. Source/drain zones 16a, 16b are then produced by arsenic ion implantation (see arrow 9) through the use of a gate electrode 15 as an implantation mask. The arsenic region 16a is produced so that it overlaps optimally well with the n+ contact 11 of the capacitor.

The transistor, thus manufactured with standard technology, has an effective channel length of approximately 0.8 μm and a width of approximately 1 μm. An estimate of the capacitance of the trench capacitor yields: C is approximately 55 fF, whereby a minimum, effective depth of 5 μm form the basis given a cross-section of 1 μm². Since the charge is stored within the trench (5) and practically no soft error sensitivity should occur due to the use of a box insulation (13) between the neighboring trenches, the capacitance, set forth above, is certain to be adequately dimensioned.

The channel region of the transistor has lateral contact to the highly doped substrate (1), so that the channel region lies at a substrate potential given even a great, vertical expanse of the source/drain space charge zone. As a result thereof, the known disadvantages of floating regions (as described in the report by Ohkura) on the transistor properties are avoided.

A further advantage of the present invention is that the doping of the deposited silicon layer 8 can be used for the optimization of important transistor properties such as, for example, the threshold voltage.

The layout of a cell arrangement created pursuant to the present invention is illustrated in FIG. 10. As illustrated, the present invention provides an extremely tight packing through the proposed, three-dimensional structure. Two respective neighboring cells are combined to form a block; they have a shared bit line contact (BL contact) and are separated from neighboring cell blocks by the box insulation (13). The word lines are referenced WL. Otherwise, the same reference characters as in FIG. 9 are utilized.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A three-dimensional, one-transistor cell arrangement for dynamic semiconductor memories, having a field effect transistor and one capacitor for the charges to be stored, the capacitor is created as a trench capacitor in the substrate, the capacitor including a first electrode formed by the substrate and a second electrode that stores the charges is formed by doped polycrystalline silicon that fills up the trench, the field effect transistor resides at the surface of the substrate and has an insulated gate electrode the capacitor separated by an insulating layer is arranged under the field effect transistor a recrystallized silicon layer is applied on the insulating layer and source/drain zones are arranged in the recrystallized silicon layer, the capacitor is connected with the source/drain zones via an electrically conductive contact and:

in an upper portion of the trench, an asymmetrical extension of the trench opening is introduced into the substrate in the upper part of the trench, the asymmetrical extension being filled with polycrystalline silicon having the same doping as in the trench, the electrically conductive contact is established via this filled extension and representing a subregion of the second electrode of the capacitor that stores the charge;

the insulating layer separating the transistor from the capacitor is arranged next to the asymmetrical extension of the trench opening in the trench having the same geometry as the lower portion of the trench; and the gate electrode of the transistor is arranged over the insulating layer and above the recrystallized silicon layer situated thereover, being arranged thereat such that the source zone generated in the recrystallized silicon layer overlaps the electrically conductive contact in the asymmetrical extension of the trench opening.

2. The three-dimensional, one-transistor cell arrangement of claim 1 wherein the depth of the asymmetrical expansion of the trench opening is less than or equal to approximately 20% of the trench depth and the expansion is less than or equal to approximately 50% of the trench cross-section.

3. The three-dimensional, one-transistor cell of claim 2 wherein the thickness of the insulation layer is less than or equal to approximately 15% of the trench depth.

4. The three-dimensional, one-transistor cell of claim 2 wherein the substrate is p+ doped, the trench fill and the asymmetrical, electrically conductive contact arranged in the trench expansion are n+ doped, the recrystallized layer containing the source/drain zones is p− doped and the source/drain zones situated therein are n+ doped.

5. The three-dimensional, one-transistor cell arrangement of claim 1 wherein the cross-sectional dimension of the trench is approximately 1 μm×7 μm given a depth of approximately 6 μm.

6. The three-dimensional, one-transistor cell arrangement of claim 1 wherein the asymmetrical expansion of the trench opening in the substrate is approximately 0.4 μm and having a depth of approximately 1 μm given a trench depth between approximately 4 to about 6 μm.

7. The three-dimensional, one-transistor cell of claim 1 wherein the thickness of the insulating layer is less than or equal to approximately 15% of the trench depth.

8. The three-dimensional, one-transistor cell of claim 5 wherein the trench depth is approximately 6 μm and given a depth of asymmetrical trench expansion of approximately 1 μm, the thickness of the insulating layer is approximately 0.5 μm.

9. The three-dimensional, one-transistor cell arrangement of claim 7 wherein the insulating layer between two neighboring trench capacitors is composed of an insulating oxide that is produced by a trench etched into the substrate and by filling this trench with $SiO_2$.

10. The three-dimensional, one transistor cell of claim 1 wherein the trench depth is approximately 6 μm and given a depth of asymmetrical trench expansion of approximately 1 μm, the thickness of the insulating layer is approximately 0.5 μm.

11. The three-dimensional, one-transistor cell of claim 1 wherein the substrate is p+ doped, the trench fill and the asymmetrical, electrically conductive contact arranged in the trench expansion are n+ doped, the recrystallized layer containing the source/drain zones is p− doped and the source/drain zones situated therein are n+ doped.

12. The three-dimensional, one-transistor cell arrangement of claim 1 wherein the insulating layer between two neighboring trench capacitors is composed of an insulating oxide that is produced by a trench etched into the substrate and by filling this trench with $SiO_2$.

13. The three-dimensional, one-transistor cell of claim 12 wherein the insulating trench has a depth of approximately 0.7 μm and a width of approximately 0.5 μm.

* * * * *